(12) United States Patent
Oettinger et al.

(10) Patent No.: US 8,130,129 B2
(45) Date of Patent: Mar. 6, 2012

(54) ANALOG-TO-DIGITAL CONVERSION

(75) Inventors: Eric Gregory Oettinger, Rochester, MN (US); Mark David Heminger, Rochester, MN (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 12/777,734

(22) Filed: May 11, 2010

(65) Prior Publication Data
US 2011/0279297 A1    Nov. 17, 2011

(51) Int. Cl.
*H03M 1/12* (2006.01)
(52) U.S. Cl. ........................ 341/155; 341/156
(58) Field of Classification Search .................. 341/155, 341/156, 161, 120, 141
See application file for complete search history.

(56) References Cited

U.S. PATENT DOCUMENTS

| 4,933,676 | A | * | 6/1990 | Hauge et al. | 341/141 |
| 5,870,052 | A | * | 2/1999 | Dedic et al. | 341/161 |
| 6,621,443 | B1 | * | 9/2003 | Selli et al. | 341/155 |
| 6,631,341 | B2 | * | 10/2003 | Kameda et al. | 702/124 |
| 7,026,969 | B2 | * | 4/2006 | Shim et al. | 341/141 |
| 7,394,415 | B2 | * | 7/2008 | Fuse et al. | 341/120 |

* cited by examiner

*Primary Examiner* — Jean Jeanglaude
(74) *Attorney, Agent, or Firm* — John J. Patti; Wade J. Brady, III; Frederick J. Telecky, Jr.

(57) ABSTRACT

One embodiment of the present invention includes an analog-to-digital converter (ADC) system. The system includes an ADC configured to generate digital samples that are digital versions of at least one analog signal at a sampling frequency and a memory configured to store data corresponding to an average value of the digital samples in at least one register. The system further includes a processor configured to access the data corresponding to the average value for processing at an access frequency that is less than the sampling frequency.

20 Claims, 2 Drawing Sheets

ANALOG-TO-DIGITAL CONVERSION

TECHNICAL FIELD

The present invention relates generally to electronic systems, and specifically to analog-to-digital conversion.

BACKGROUND

Typical computer systems can include one or more analog-to-digital converters (ADCs) configured to convert analog data into digital data for processing. In many electronic systems, such as embedded systems, an ADC can perform conversions at a rate that is faster than what the rest of the system is capable of processing. As one example, the ADC may repeatedly convert a sequence of channels corresponding to separate data sources to digital data, with analog data from some of the channels being processed more frequently than others. As another example, a processor can perform limit checking of some digital data very rapidly, but may process other digital data much more infrequently. Therefore, to process the digital data, a single sample of the digital data may be processed while the remaining samples are discarded.

SUMMARY

One embodiment of the present invention includes an analog-to-digital converter (ADC) system. The system includes an ADC configured to generate digital samples that are digital versions of at least one analog signal at a sampling frequency and a memory configured to store data corresponding to an average value of the digital samples in at least one register. The system further includes a processor configured to access the data corresponding to the average value for processing at an access frequency that is less than the sampling frequency.

Another embodiment of the present invention includes a method for digitally processing analog data. The method includes receiving an analog signal and converting the analog signal to digital samples at a sampling frequency. The method also includes storing a running sum of the digital samples in a register of a memory. The method further includes incrementing a count value corresponding to the number of digital samples in the running sum in the register of the memory.

Yet another embodiment of the present invention includes an analog-to-digital converter (ADC) system. The system includes an ADC configured to generate digital samples that are digital versions of a plurality of analog signals provided from a respective plurality of data sources at a sampling frequency. The system also includes a memory configured to store a plurality of sets of data that each correspond to an average value of the digital samples of each of the plurality of analog signals in a respective plurality of registers. The system further includes a processor configured to access the data corresponding to an average value of the digital samples of each of the plurality of analog signals for processing at an access frequency associated with each of the plurality of sets of data that is less than the sampling frequency associated with each of the plurality of data sources.

DETAILED DESCRIPTION

The present invention relates generally to electronic systems, and specifically to analog-to-digital conversion. An analog-to-digital converter (ADC) may receive an analog signal and generate digital samples of the analog signal. The digital samples can be stored in a register of a memory, such as a 32-bit word, as a running sum of the digital samples and a count value corresponding to the number of digital samples in the running sum. As an example, the running sum can occupy the Y most-significant bits (MSBs) of the register (e.g., 22 MSBs) and the count value can occupy the X least-significant bits (LSBs) of the register (e.g., 10 LSBs). Therefore, the register stores data associated with an average value of the digital samples.

A processor may be configured to access the data stored in the memory at an access frequency that is less than the sample frequency of the ADC. As an example, the processor may access the data at a slower rate than the ADC sample frequency because the processor dedicates a majority of machine instructions per second (MIPS) toward other critical processing resources. As another example, the processor may access the data at a slower rate based on the processor accessing several sets of data that is converted to digital samples by the ADC, with some of the sets of data being accessed by the processor at different frequencies. Therefore, the processor can access the register corresponding to the data to be used for processing and calculates the average of all of the digital samples converted by the ADC based on the running sum and the count value that is stored in the register. Therefore, all of the digital samples from the data source are utilized in the data accessed by the processor instead of the processor accessing a single snapshot digital sample for processing, with the rest of the digital samples obtained by the ADC being discarded. As a result, the digital value used by the processor that is the average of all of the digital samples has more resolution and more noise immunity than a single snapshot digital sample converted by the ADC.

Figure 1:
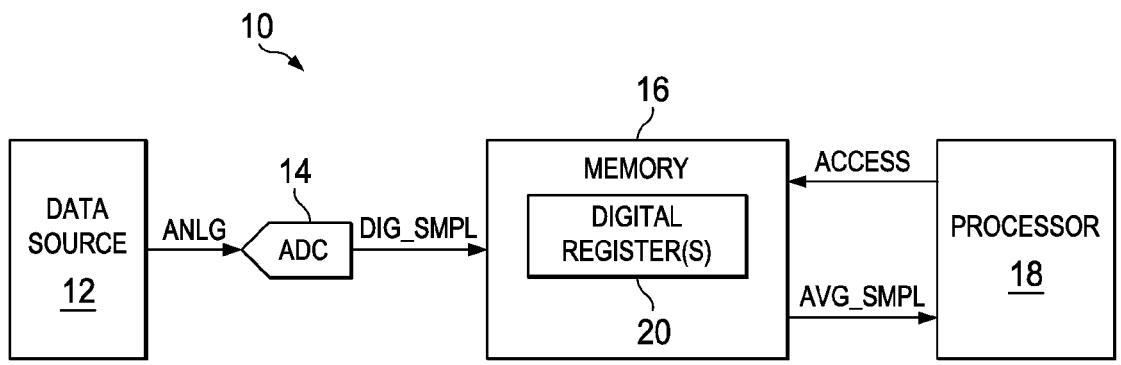
FIG. 1 illustrates an example of an analog-to-digital conversion system in accordance with an aspect of the invention.

FIG. 1 illustrates an example of an analog-to-digital conversion system 10 in accordance with an aspect of the invention. The system 10 can be implemented in any of a variety of computer applications. The system 10 includes a data source 12 configured to generate an analog input signal ANLG and an analog-to-digital converter (ADC) 14 that is configured to generate digital samples DIG_SMPL of the analog input signal ANLG. As an example, the ADC 12 can be a 12-bit ADC. The data source 12 can be any of a variety of data sources, such as a temperature sensor, that can provide the analog input signal ANLG to indicate an operating condition that is monitored for a variety of reasons. For example, the analog input signal ANLG could indicate a possible fault. The analog input signal ANLG can thus be a voltage indicating the operating condition. The ADC 14 can generate the digital samples DIG_SMPL at a high sampling rate frequency (e.g., greater than 100 kHz).

The system 10 also includes a memory 16 and a processor 18. As an example, the memory 16 can be any of a variety of memories, such as part of a non-volatile memory or a portion of cache memory associated with the processor 18. The ADC 14 provides the digital samples DIG_SMPL to the memory 16 and the processor 18 is configured, inter alia, to access data from the memory 16. In the example of FIG. 1, the processor 18 is demonstrated as providing a signal ACCESS to the memory 16 that indicates access of the memory 16 by the processor 18. It is to be understood, however, that the signal ACCESS is demonstrated diagrammatically merely to indicate the access of the memory 16 by the processor 18, such that the processor 18 can access the memory 16 in any of a variety of ways. The processor 18 can access the memory 16 at an access frequency that is less than the sampling frequency of the ADC 14. For example, the processor 18 may require dedicated processing capability for other more critical applications, and thus may not be capable of accessing the memory 16 at a frequency that is greater than or equal to the sampling frequency of the ADC 14.

The memory 16 includes at least one digital register 20 that is configured to store data associated with an average of the digital samples DIG_SMPL. Specifically, the at least one digital register 20 can include a first portion that stores a running sum of the digital samples DIG_SMPL and a second portion that stores a count value that corresponds to the number of digital samples DIG_SMPL that constitute the running sum. As an example, the count value can occupy the least-significant bits (LSBs) of the at least one digital register 20 and the running sum can occupy the most-significant bits (MSBs) of the at least one digital register 20. Therefore, upon accessing the memory 16 to fetch information regarding the operating condition provided by the data source 12 as indicated by the analog input signal ANLG, the processor 18 can access the count value and the running sum from the at least one register 20 to calculate an average value of the digital samples DIG_SMPL. In the example of FIG. 1, the average value of the digital samples DIG_SMPL that is calculated via the data stored in the at least one digital register 20 is demonstrated as a signal AVG_SMPL provided to the processor 18. As a result, the processor 18 utilizes all of the digital samples DIG_SMPL instead of just a single snapshot digital sample for processing the information regarding the data source 12. Accordingly, by implementing the average of the digital samples DIG_SMPL instead of a single digital sample for processing the data, the processor 18 implements a more resolute and more noise immune set of data.

Figure 2:
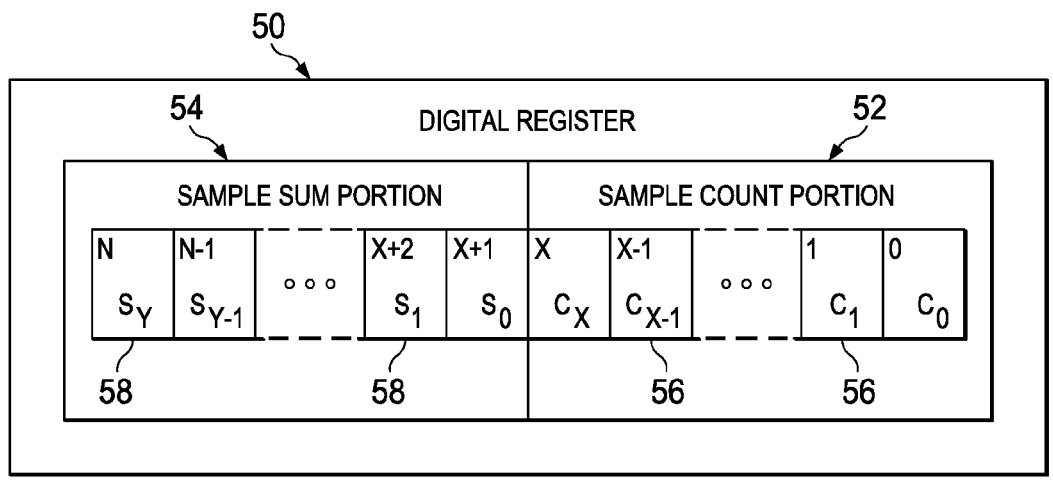
FIG. 2 illustrates an example of a digital register in accordance with an aspect of the invention.

FIG. 2 illustrates an example of a digital register 50 in accordance with an aspect of the invention. The digital register 50 can correspond to one of the one or more digital registers 20 in the example of FIG. 1. Therefore, reference is to be made to the example of FIG. 1 in the following description of the example of FIG. 2.

The digital register 50 is demonstrated in the example of FIG. 2 as an N-bit word that includes a sample count portion 52 and a sample sum portion 54. The sample count portion 52 is demonstrated in the example of FIG. 2 as occupying the X LSBs of the digital register 50, where X is a positive integer. Specifically, the sample count portion 52 is demonstrated as bit cells 56, demonstrated in the example of FIG. 2 as $C_0$ through $C_X$. Similarly, the sample sum portion 54 is demonstrated in the example of FIG. 2 as occupying the Y MSBs of the digital register 50, where Y is a positive integer. Specifically, the sample sum portion 54 is demonstrated as bit cells 58, demonstrated in the example of FIG. 2 as $S_0$ through $S_Y$.

The manner in which the number of bits of the digital register 50 are divided between each of the sample count portion 52 and the sample sum portion 54 can be based on a variety of factors. As an example, the division of the number of bits of the digital register 50 between each of the sample count portion 52 and the sample sum portion 54 can be based on the precision of the associated ADC, such as the ADC 14 in the example of FIG. 1. Specifically, the number of bits in the sample sum portion 54 can be equal to the number of bits of precision of the ADC plus half the remaining bits of a number of bits of the digital register 50 minus the number of bits of precision of the ADC. In other words, the number of bits of the sample sum portion 54 can be equal to $A+(N-A)/2$, where A is the number of bits of precision of the ADC and N is the number of bits of the digital register 50 in the example of FIG. 2. Thus, the remaining bits of the digital register 50 can be designated as the sample count portion 52. For example, the ADC 14 in the example of FIG. 1 can be a 12-bit ADC and the digital register 50 can be a 32-bit word. As a result, the sample sum portion 54 can occupy the 22 MSBs of the 32-bit word of the digital register 50 (i.e., 12-bits corresponding to the ADC precision, plus half of 32-bits of the word minus the 12-bits of the ADC). Therefore, the sample count portion 52 can occupy the 10 LSBs of the 32-bit word of the digital register 50. Such a manner of dividing the bits of the digital register 50 between the sample count portion 52 and the same sum portion 54 can result in better computational efficiency, and substantially mitigates the chance of the sample count portion 52 rolling over into the sample sum portion 54.

The sample count portion 52 is configured to store a binary value that corresponds to the number of digital samples DIG_SMPL that are aggregately stored in the digital register 50. The sample sum portion 54 is configured to store a binary value corresponding to a sum of all of the digital samples DIG_SMPL received and represented by the count value. Therefore, the count value stored in the sample count portion 52 and the sample sum stored in the sample sum portion 54 collectively represent data corresponding to an average value of the digital samples DIG_SMPL. Because the sample count portion 52 and the sample sum portion 54 are arranged in a single word in the digital register 50, the data therein is accessible by the processor 18 as a single unit, such that no interrupt and/or hardware update can occur between the reading and/or writing of the data in the digital register 50. As a result, corruption of the data stored in the digital register 50 resulting from interrupts and/or hardware updates, such as could skew the average value of the digital samples DIG_SMPL, is substantially mitigated.

As an example, the processor 18 can implement fixed-point division to calculate the average value of the digital samples DIG_SMPL and maintain the same scaling of the count value and the running sum in the sample count portion 52 and the sample sum portion 54, respectively. For example, the sample count portion 52, occupying the LSBs of the digital register 50, can be considered fractional bits in the calculation of the average value of the digital samples DIG_SMPL, such as represented in Q-notation of integer bits and fractional bits. Thus, the 32-bit digital register 50 with the 22 MSB sample sum portion 54 and the 10 LSB sample count portion 52 can be represented as (q22, 10), representing 22 integer bits for the sample sum portion 54 and 10 fractional bits for the sample count portion 52. Therefore, to add a digital sample to the digital register 50, the digital sample DIG_SMPL can be scaled to the MSB sample sum portion 54 by setting the sample count portion 52 as a 10-bit fractional portion of the digital sample DIG_SMPL, such as (q12, 10) in the example of a 12-bit ADC 14. As a result, to calculate the average value of the digital samples DIG_SMPL, the processor 18 can mask the sample count portion 52 of the digital register 50 and convert the result to a fraction-less floating-point binary number (e.g., (q22, 10), where the 10 fractional bits are all "0") to extract the running sum. The processor 18 can likewise mask the sample sum portion 54, such that the count value can likewise be considered a floating-point binary number with no fractional bits (e.g., q10, 0). Accordingly, the processor 18 can divide the sample sum portion 54 (e.g., (q22, 10)) by the sample count portion 52 (e.g., (q10, 0)) to achieve an average value of the digital samples DIG_SMPL having the same scale as each of the individual digital samples DIG_SMPL added to the sample sum portion 54 (e.g., q12, 10).

It is to be understood that the digital register 50 is not intended to be limited to the example of FIG. 2. As an example, the digital register 50 is not limited to the arrangement of the sample count portion 52 occupying the LSBs and the sample sum portion 54 occupying the MSBs of the digital register 50, but could instead include other arrangements of the digital count and sample sum portions 52 and 54 within the digital register 50. In addition, the digital register 50 could include additional data, such as data that is relevant to the data stored in the digital count and sum portions 52 and 54. Therefore, the digital register 50 can be configured in any of a variety of ways.

Figure 3:
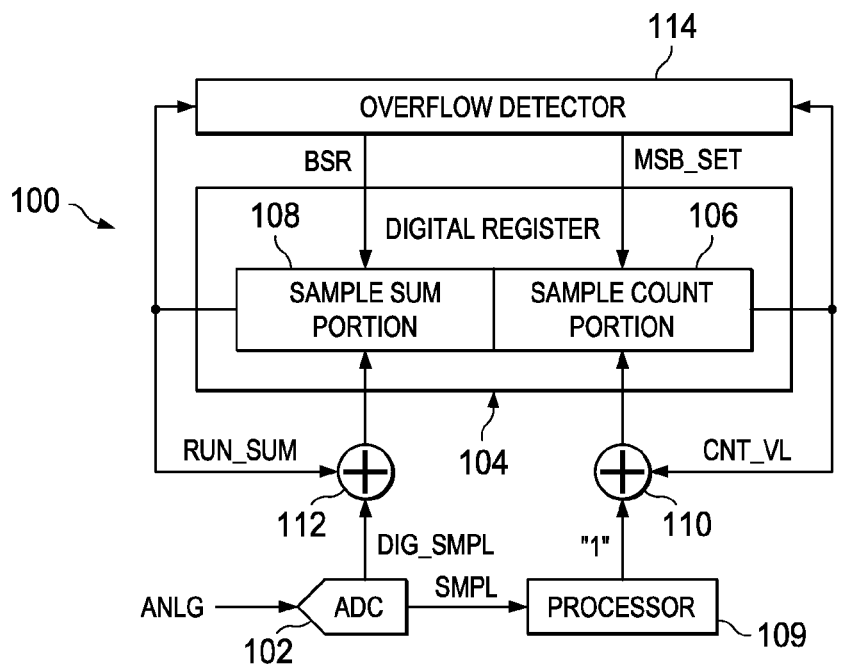
FIG. 3 illustrates another example of an analog-to-digital conversion system in accordance with an aspect of the invention.

FIG. 3 illustrates another example of an analog-to-digital conversion system 100 in accordance with an aspect of the invention. The system 100 includes an ADC 102 that is configured to generate digital samples DIG_SMPL of an analog input signal ANLG that is generated from a data source (not shown). The system 100 also includes a digital register 104, such as could be incorporated in any of a variety of memories (not shown). The digital register 104 can be configured substantially similar to the digital register 50 demonstrated in the example of FIG. 2. Specifically, the digital register 104 includes a sample count portion 106 that stores a count value of the digital samples DIG_SMPL and a sample sum portion 108 that stores a running sum of the digital samples DIG_SMPL. In addition, the analog-to-digital conversion system 100 demonstrates a processor 109, such as a processor that can be configured to access the digital register 104.

In the example of FIG. 3, for each digital sample DIG_SMPL generated by the ADC 102 corresponding to the analog input signal ANLG, the respective one of the digital samples DIG_SMPL is added to the running sum of the digital samples DIG_SMPL that is stored in the sample sum portion 108, demonstrated as RUN_SUM in the example of FIG. 3, such as based on a fixed-point summation as described above. Concurrently, the ADC 102 provides a signal SMPL to the processor 109 that signals the processor 109 to add a "1" to the count value that is stored in the sample count portion 106, demonstrated as CNT_VL in the example of FIG. 3. Therefore, the count value CNT_VL is incremented by one with the addition of the digital sample DIG_SMPL to the running sum RUN_SUM. In the example of FIG. 3, the addition of the digital sample DIG_SMPL to the running sum RUN_SUM and of the "1" to the count value CNT_VL is demonstrated by adders 110 and 112, respectively. It is to be understood that the adders 110 and 112 are demonstrated diagrammatically, such that the adders 110 and 112 can represent software instructions, such as provided by the processor, to perform the desired arithmetic operations.

Upon accessing the digital register 104 to obtain the average value of the digital samples DIG_SMPL, the processor 109 can clear the digital register 104, such that the running sum RUN_SUM and the count value CNT_VL are set to zero. Alternatively, the digital register 104 can retain the running sum RUN_SUM and the count value CNT_VL associated with the digital samples DIG_SMPL, and can thus continue to add more digital samples DIG_SMPL to the running sum RUN_SUM and to increment the count value CNT_VL accordingly. Therefore, after a given amount of time of accumulating the running sum RUN_SUM and the count value CNT_VL, the sample count portion 106 can experience overflow. Specifically, the binary value of the count value CNT_VL can exceed the binary capacity of the sample count portion 106.

The system 100 includes an overflow detector 114 that monitors the binary value of both the count value CNT_VL and the running sum RUN_SUM to determine the occurrence of an overflow condition. As an example, the overflow detector 114 can be configured to determine if an overflow occurred in the sample count portion 106 based on a binary zero value of the count value CNT_VL. The overflow detector 114 could also only determine an overflow associated with the count value CNT_VL if the running sum RUN_SUM has a non-zero value when the count value CNT_VL is zero to distinguish the overflow from a clearing of the digital register 104. In response to the detected overflow condition, the overflow detector 114 can be configured to provide a signal MSB_SET to the sample count portion 106 and a signal BSR to the sample sum portion 108. The signal MSB_SET can set the MSB of the sample count portion 106 to a logic "1", thus dividing the count value CNT_VL by two. As an example, for a 10-bit sample count portion 106, setting the MSB of the sample count portion 106 that is detected to have a binary zero value divides the number of sample counts from 1024 to 512. In addition, the signal BSR can implement a bit-shift-right operation on the sample sum portion 108 to likewise divide the sample sum by two. Therefore, the overflow detector 114 can divide both the count value CNT_VL and the running sum RUN_SUM by two concurrently to correct the overflow condition without corrupting the average value of the digital samples DIG_SMPL. It is to be understood that the overflow detector 114 is not limited to division by two, but could divide both the sample count portion 106 and the sample sum portion 108 by another binary value (e.g., four or eight) by setting a different bit to a logic "1" in the sample count portion 106 and implementing additional bit-shift-right operations.

It is to be understood that the system 100 is not intended to be limited to the example of FIG. 3. As an example, the adders 110 and 112, as well as the overflow detector 114, are demonstrated diagrammatically, such that the adders 110 and 112 and the overflow detector 114 can be implemented as software and/or a combination of software and hardware. For example, the functionality of the adders 110 and 112 and the overflow detector 114 can be provided by an associated processor, such as the processor that can access the digital register 14 for the average value of the digital samples DIG_SMPL.

Figure 4:
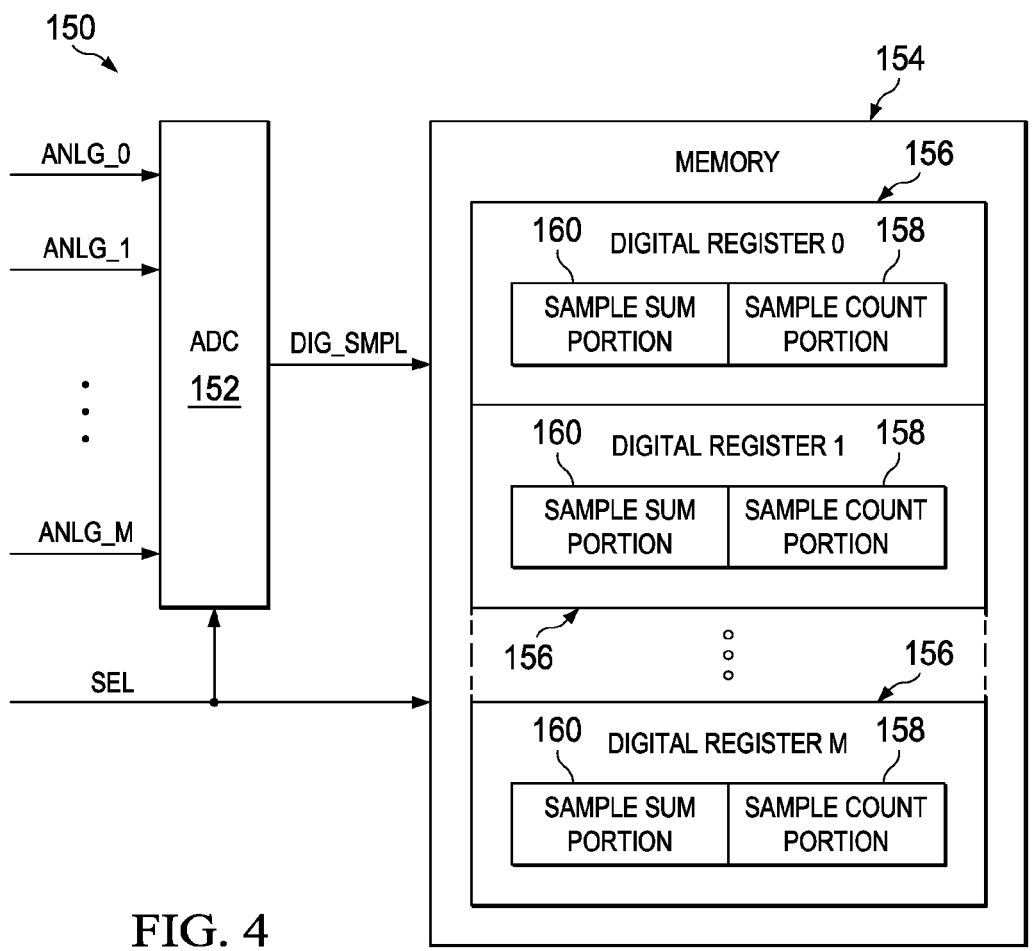
FIG. 4 illustrates yet another example of an analog-to-digital conversion system in accordance with an aspect of the invention.

FIG. 4 illustrates yet another example of an analog-to-digital conversion system 150 in accordance with an aspect of the invention. The system 150 includes an ADC 152 that is configured to generate digital samples DIG_SMPL of a plurality M of analog input signals ANLG_0 through ANLG_M, where M is a positive integer, that are each generated from a distinct data source (not shown). As an example, the ADC 152 can be configured to cycle through the analog signals ANLG_0 through ANLG_M based on a selection signal SEL. The selection signal SEL can command the ADC 152 to cycle through the analog signals ANLG_0 through ANLG_M in a predefined sequence or in a dynamic sequence to generate a corresponding digital sample DIG_SMPL that corresponds to a specific one of the analog signals ANLG_0 through ANLG_M.

The system 100 also includes a memory 154, which could be any of a variety of memories, such as a RAM or a cache.

The memory 154 includes a plurality M of digital registers 156, each corresponding to a respective one of the analog input signals ANLG_0 through ANLG_M. Each of the digital registers 156 can be configured substantially similar to the digital register 50 demonstrated in the example of FIG. 2. Specifically, each of the digital registers 156 includes a sample count portion 158 that stores a count value of the digital samples DIG_SMPL and a sample sum portion 160 that stores a running sum of the digital samples DIG_SMPL for the respective one of the analog input signals ANLG_0 through ANLG_M. Thus, the selection signal SEL can likewise be provided to the memory 156 to command the respective one of the digital registers 156 to store the digital sample DIG_SMPL corresponding to one of the analog input signals ANLG_0 through ANLG_M.

An associated processor (not shown) can access the digital registers 156 to obtain data associated with the average value of the digital samples DIG_SMPL corresponding to the respective analog input signals ANLG_0 through ANLG_M. As an example, the processor can access some of the digital registers 156 more frequently than others, and can access each of the digital registers 156 less frequently than the sampling frequency of the ADC 152. For example, the processor may require dedicated processing capability for other more critical applications, and thus may not be capable of accessing the memory 154 at a frequency that is greater than or equal to the sampling frequency of the ADC 152. Therefore, similar to as described above in the example of FIG. 1, by implementing the average of the digital samples DIG_SMPL instead of a single digital sample for processing the data, the processor implements a more resolute and more noise immune set of data.

Figure 5:
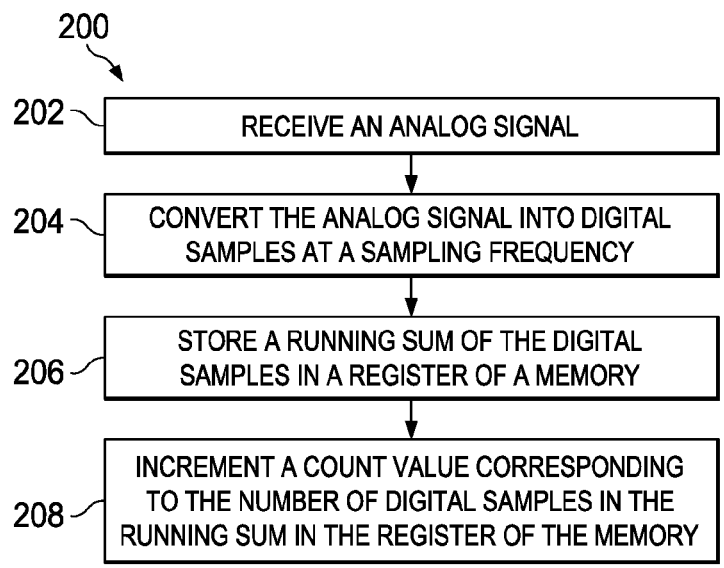
FIG. 5 illustrates an example of a method for digitally processing analog data in accordance with an aspect of the invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for digitally processing analog data. At 202, an analog signal is received. The analog signal can be a voltage or current signal that is generated from a single data source or could be one of a plurality of analog signals generated from multiple data sources. The data sources could be sensors. At 204, the analog signal is converted to digital samples at a sampling frequency. The conversion can be accomplished via an ADC.

At 206, a running sum of the digital samples is stored in a register of a memory. The memory could be any of a variety of memory types, such as a RAM or cache memory. The register can be an N-bit word, such as a 32-bit word. The running sum can be stored in a portion of the register, such as Y-bits (e.g., 22 bits) of the MSB portion of the register. At 208, a count value corresponding to the number of digital samples in the running sum is incremented in the register of the memory. The count value can be stored in another portion of the register, such as X-bits (e.g., 10 bits) of the LSB portion of the register. The count value and the running sum can thus be collectively implemented to obtain an average value of all of the digital samples for processing.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An analog-to-digital converter (ADC) system comprising:
    an ADC configured to generate digital samples that are digital versions of at least one analog signal at a sampling frequency;
    a memory configured to store data corresponding to an average value of the digital samples in at least one register; and
    a processor configured to access the data corresponding to the average value for processing at an access frequency that is less than the sampling frequency.

2. The system of claim 1, wherein each of the at least one register comprises:
    a sample sum portion comprising a running sum of the digital samples; and
    a sample count portion comprising a count value associated with a number of the digital samples represented by the running sum of the digital samples.

3. The system of claim 2, wherein the processor is further configured to access each of the sample sum portion and the sample count portion and to generate the average value based on the count value and the running sum of the digital samples.

4. The system of claim 2, wherein the sample count portion occupies X bits of each of the at least one register and the sample sum portion occupies Y bits of each of the at least one register, where X and Y are each positive integers having a sum that equals a total number of bits N of each of the at least one register.

5. The system of claim 4, wherein the sample count portion occupies the X least-significant bits of each of the at least one register and wherein the sample sum portion occupies the Y most-significant bits of each of the at least one register.

6. The system of claim 5, wherein Y is equal to $A+(N-A)/2$, where A is an integer corresponding to a number of bits of precision of the ADC, and wherein X is equal to $N-Y$.

7. The system of claim 2, further comprising an overflow detector configured to detect an overflow condition in the sample count portion and to change the count value and the running sum of the digital samples in the sample count portion and the sample sum portion, respectively, to maintain the average value.

8. The system of claim 7, wherein the overflow detector is configured to detect a zero binary value in the sample count portion to detect the overflow condition, and in response to the overflow condition, is further configured to divide the count value and the running sum by an equal binary value by setting a logic "1" in a most-significant bit of the sample count portion and providing a bit-shift-right operation to the sample sum portion to maintain the average value.

9. The system of claim 1, wherein the at least one analog signal comprises a single analog signal that is generated from a single data source, and wherein the at least one register comprises a single register corresponding to the single data source.

10. The system of claim 1, wherein the at least one analog signal comprises a plurality of analog signals that are provided from a respective plurality of data sources that are multiplexed to the ADC, the memory being configured to store a respective plurality of sets of data corresponding to average values of a respective plurality of digital samples in a respective plurality of registers.

11. A method for digitally processing analog data, the method comprising:
    receiving an analog signal;
    converting the analog signal to digital samples at a sampling frequency;
    storing a running sum of the digital samples in a register of a memory; and
    incrementing a count value corresponding to the number of digital samples in the running sum in the register of the memory.

12. The method of claim 11, further comprising:
    accessing the register via a processor at an access frequency that is less than the sampling frequency; and
    calculating an average value of the digital samples based on the count value and the running sum of the digital samples.

13. The method of claim 11, wherein storing the running sum of the digital samples comprises storing the running sum of the digital samples in a first portion of a word in the memory, and wherein incrementing the count value comprises incrementing the count value stored in a second portion of the word in the memory.

14. The method of claim 13, wherein the first portion of the word comprises Y most-significant bits of the word and wherein the second portion of the word comprises X least-significant bits of the word, where X and Y are each positive integers having a sum that equals a total number of bits of the word, and where Y is greater than X.

15. The method of claim 11, further comprising:
    detecting an overflow condition associated with the count value;
    dividing a magnitude of the running sum and the count value by an equal binary value in response to detecting the overflow condition to maintain an average value of the digital samples.

16. The method of claim 15, wherein detecting the overflow detector comprises detecting a count value of zero, and wherein dividing the magnitude of the running sum and the count value comprises setting a logic "1" in a most-significant bit of the count value and to implementing a bit-shift-right operation to the running sum to maintain the average value.

17. An analog-to-digital converter (ADC) system comprising:
    an ADC configured to generate digital samples that are digital versions of a plurality of analog signals provided from a respective plurality of data sources at a sampling frequency;
    a memory configured to store a plurality of sets of data that each correspond to an average value of the digital samples of each of the plurality of analog signals in a respective plurality of registers; and
    a processor configured to access the data corresponding to an average value of the digital samples of each of the plurality of analog signals for processing at an access frequency associated with each of the plurality of sets of data that is less than the sampling frequency associated with each of the plurality of data sources.

18. The system of claim 17, wherein each of the plurality of registers comprises:
    a sample sum portion stored in the Y most-significant bits of each of the plurality of registers, the sample sum portion comprising a running sum of the digital samples; and
    a sample count portion stored in the X least-significant bits of each of the plurality of registers, the sample count portion comprising a count value of the number of the digital samples represented by the running sum of the digital samples, where X and Y are each positive integers having a sum that equals a total number of bits of the word, and where Y is greater than X.

19. The system of claim 18, wherein the processor is further configured to access each of the sample sum portion and the sample count portion and to generate the average value based on the count value and the running sum of the digital samples.

20. The system of claim 18, further comprising an overflow detector configured to detect an overflow condition in the sample count portion based on a zero in the count value and, in response to detecting the overflow condition, is further configured to divide the count value and the running sum by an equal binary value by setting a logic "1" in a most-significant bit of the sample count portion and providing a bit-shift-right operation to the sample sum portion to maintain the average value.

* * * * *